(12) United States Patent
Hu

(10) Patent No.: US 10,236,245 B2
(45) Date of Patent: Mar. 19, 2019

(54) PACKAGE SUBSTRATE WITH EMBEDDED CIRCUIT

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 15/078,010

(22) Filed: Mar. 23, 2016

(65) Prior Publication Data

US 2017/0278779 A1    Sep. 28, 2017

(51) Int. Cl.
| | | |
|---|---|---|
| *H01L 23/49* | (2006.01) | |
| *H01L 23/498* | (2006.01) | |
| *H01L 23/31* | (2006.01) | |
| *H01L 21/48* | (2006.01) | |
| *H01L 23/538* | (2006.01) | |
| *H01L 21/683* | (2006.01) | |

(52) U.S. Cl.
CPC .... *H01L 23/49838* (2013.01); *H01L 21/4857* (2013.01); *H01L 21/6835* (2013.01); *H01L 23/3128* (2013.01); *H01L 23/3142* (2013.01); *H01L 23/49822* (2013.01); *H01L 23/49827* (2013.01); *H01L 23/5383* (2013.01); *H01L 23/5384* (2013.01); *H01L 23/5389* (2013.01); H01L 23/49816 (2013.01); H01L 2221/68345 (2013.01); H01L 2224/16225 (2013.01); H01L 2224/32225 (2013.01); H01L 2224/73204 (2013.01); H01L 2924/15311 (2013.01)

(58) Field of Classification Search
CPC ... H01L 23/49; H01L 23/31; H01L 23/49838; H01L 21/4857; H01L 21/6835; H01L 23/3128

USPC ................ 257/668, 774, 691, 698, 516, 667
See application file for complete search history.

(56) References Cited

U.S. PATENT DOCUMENTS

| | | | | |
|---|---|---|---|---|
| 6,900,534 | B2 * | 5/2005 | Murtuza | H01L 23/3114 257/701 |
| 9,247,647 | B1 * | 1/2016 | Yoon | H01F 17/0006 |
| 9,287,250 | B2 | 3/2016 | Inagaki et al. | |
| 2005/0218502 | A1 * | 10/2005 | Sunohara | H01L 23/49822 257/700 |
| 2005/0242422 | A1 * | 11/2005 | Klein | H01L 21/563 257/686 |
| 2007/0222054 | A1 * | 9/2007 | Hembree | H05K 3/4046 257/686 |
| 2009/0102066 | A1 * | 4/2009 | Lee | H01L 21/6835 257/784 |
| 2009/0261466 | A1 * | 10/2009 | Pagaila | H01L 21/6835 257/686 |
| 2010/0148316 | A1 * | 6/2010 | Kim | H01L 21/6835 257/621 |
| 2010/0327439 | A1 * | 12/2010 | Hwang | H01L 23/481 257/737 |
| 2011/0068427 | A1 * | 3/2011 | Paek | H01L 24/19 257/433 |
| 2011/0176280 | A1 * | 7/2011 | Lee | H01L 25/16 361/721 |
| 2011/0186998 | A1 * | 8/2011 | Wu | H01L 21/486 257/738 |

(Continued)

*Primary Examiner* — Sheikh Maruf
(74) *Attorney, Agent, or Firm* — JCIPRNET

(57) ABSTRACT

A package substrate with embedded circuit is disclosed. The package substrate comprises a redistribution layer, the redistribution layer comprises a plurality of circuits, each circuit of the plurality of circuits runs with a top surface coplanar with a top surface of the dielectric material.

20 Claims, 12 Drawing Sheets

(56) References Cited

U.S. PATENT DOCUMENTS

| | | | | |
|---|---|---|---|---|
| 2011/0210444 A1* | 9/2011 | Jeng | H01L 23/13 | 257/738 |
| 2011/0260303 A1* | 10/2011 | Pagaila | H01L 23/36 | 257/660 |
| 2011/0278732 A1* | 11/2011 | Yu | H01L 23/481 | 257/774 |
| 2012/0013019 A1* | 1/2012 | Sakamoto | H01L 23/5225 | 257/774 |
| 2012/0049364 A1* | 3/2012 | Sutardja | H01L 24/24 | 257/738 |
| 2012/0061821 A1* | 3/2012 | Black | H01L 23/481 | 257/774 |
| 2012/0161332 A1* | 6/2012 | Chua | H01L 21/486 | 257/774 |
| 2012/0299191 A1* | 11/2012 | Camacho | H01L 21/561 | 257/774 |
| 2013/0037929 A1* | 2/2013 | Essig | H01L 23/49816 | 257/693 |
| 2013/0037950 A1* | 2/2013 | Yu | H01L 23/49816 | 257/738 |
| 2013/0093091 A1* | 4/2013 | Ma | H01L 21/76898 | 257/751 |
| 2013/0105973 A1* | 5/2013 | Gan | H01L 23/3121 | 257/738 |
| 2013/0105991 A1* | 5/2013 | Gan | H01L 25/105 | 257/777 |
| 2013/0168134 A1* | 7/2013 | Tominaga | H05K 3/4673 | 174/251 |
| 2013/0175706 A1* | 7/2013 | Choi | H01L 25/074 | 257/777 |
| 2013/0200528 A1* | 8/2013 | Lin | H01L 21/6836 | 257/774 |
| 2014/0042565 A1* | 2/2014 | Fuergut | H04R 19/005 | 257/416 |
| 2014/0217610 A1* | 8/2014 | Jeng | H01L 23/3128 | 257/774 |
| 2014/0319698 A1* | 10/2014 | Molin | H01L 23/481 | 257/774 |
| 2015/0021764 A1* | 1/2015 | Paek | H01L 23/3185 | 257/737 |
| 2015/0091183 A1* | 4/2015 | Fischer | H01L 21/76877 | 257/774 |
| 2015/0221523 A1* | 8/2015 | Zundel | H01L 23/49838 | 257/734 |
| 2015/0228594 A1* | 8/2015 | Alvarado | H01L 24/06 | 257/737 |
| 2015/0243636 A1* | 8/2015 | Hu | H01L 24/19 | 257/741 |
| 2015/0255426 A1* | 9/2015 | Son | H01L 21/6835 | 438/107 |
| 2015/0255429 A1* | 9/2015 | Katkar | H01L 25/0657 | 257/712 |
| 2015/0357316 A1* | 12/2015 | Inagaki | H01L 25/18 | 257/774 |
| 2015/0371932 A1* | 12/2015 | Hu | H01L 21/4825 | 257/666 |
| 2015/0371938 A1* | 12/2015 | Katkar | H01L 25/50 | 257/774 |
| 2016/0035661 A1* | 2/2016 | Suzuki | H01L 23/49822 | 174/251 |
| 2016/0035667 A1* | 2/2016 | Huang | H01L 21/561 | 257/668 |
| 2016/0056055 A1* | 2/2016 | Ko | H01L 23/562 | 438/107 |
| 2016/0056087 A1* | 2/2016 | Wu | H01L 23/49833 | 257/738 |
| 2016/0056100 A1* | 2/2016 | Yeh | H01L 24/81 | 257/676 |
| 2016/0093572 A1* | 3/2016 | Chen | H01L 21/4857 | 257/774 |
| 2016/0133601 A1* | 5/2016 | Ko | H01L 21/78 | 257/738 |
| 2016/0218057 A1* | 7/2016 | Lee | H05K 1/113 | |
| 2016/0218133 A1* | 7/2016 | Ho | H01L 27/14618 | |
| 2016/0322330 A1* | 11/2016 | Lin | H01L 25/0652 | |
| 2017/0069558 A1* | 3/2017 | Bang | H01L 23/3128 | |
| 2017/0092617 A1* | 3/2017 | Wu | H01L 23/5389 | |

* cited by examiner

PACKAGE SUBSTRATE WITH EMBEDDED CIRCUIT

BACKGROUND

Technical Field

The present invention relates to a package substrate, especially relates to a package substrate having embedded circuit, the circuit runs with a top surface coplanar with a top surface of the dielectric material.

Description of Related Art

FIG. 1 Shows a Prior Art.

FIG. 1 shows that U.S. Pat. No. 9,287,250 disclosed a package substrate for chip. A core substrate 30 is configured in a middle layer. A top solder resist layer 70F is configured on a top side of the package substrate, and a bottom solder resist layer 70S is configured on a bottom side of the package substrate. A first circuit layer 158Fa is embedded in a dielectric material 150Fb. A second circuit layer 58S is embedded in a dielectric material 150Sa. Please pay attention to the thickness of the circuit 158Fa and the dielectric material 150Fb where the circuit 158Fa is embedded. The thickness of the dielectric material 150Fb is far greater than the thickness of the circuit 158Fa. Similarly, a thickness of the dielectric material 150Sa is far greater than the thickness of the circuit 58S.

Following the quick development of package technology in the semiconductor industry, a requirement for package density in the semiconductor chip package technology is higher and higher. The thick dielectric material occupies height space a lot. It would be great helpful to advance the density for package technology in thickness direction if the dielectric material above a top surface of the circuit can be smaller or even eliminated.

DETAILED DESCRIPTION OF THE INVENTION

A package substrate has circuit embedded in a dielectric material, and a thickness of the circuit is equal to a thickness of the dielectric material where the circuit is embedded. The package substrate has a thinner total thickness and suitable for higher density package requirement for semiconductor package technology.

Figure 1:
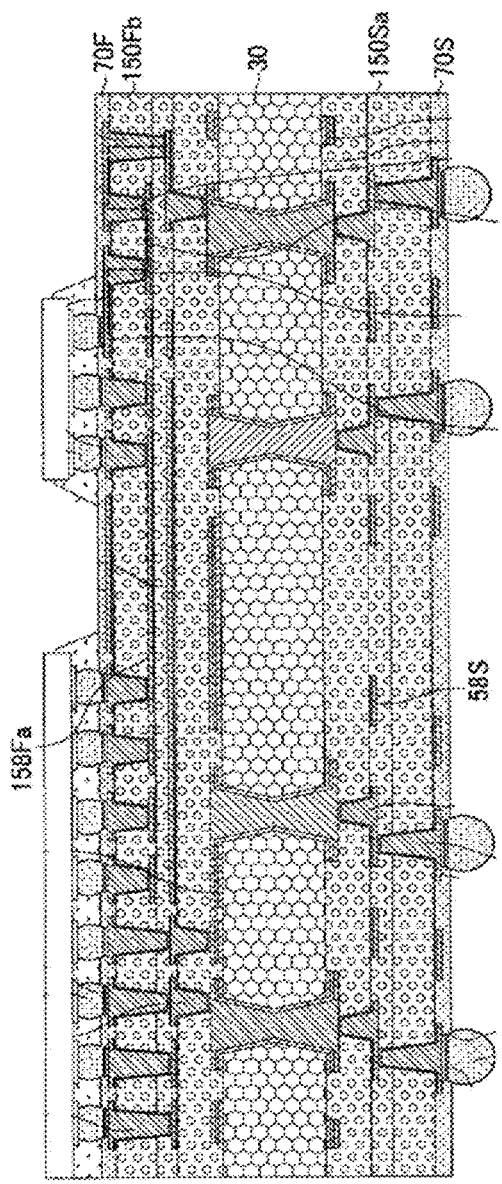
FIG. 1 shows a prior art.
Figure 2A:
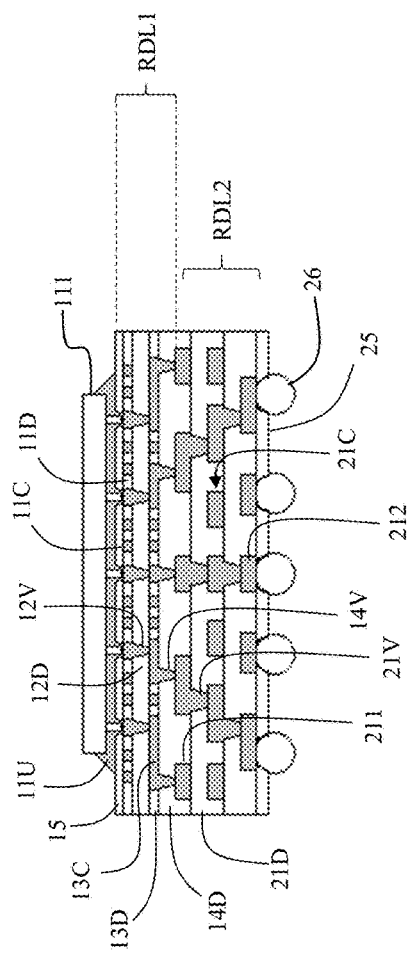
FIGS. 2A~2B shows a first embodiment according to the present invention.
Figure 2B:
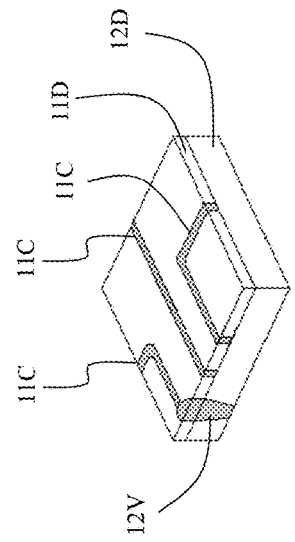

FIGS. 2A~2B Shows a First Embodiment According to the Present Invention.

FIG. 2A shows a package substrate with embedded circuit, which comprises a first redistribution layer RDL1.

The first redistribution layer RDL1 comprises at least a first circuit 11C embedded in a first dielectric material 11D. A plurality of first metal vias 12V electrically couples neighboring circuit layers. A thickness of the first circuit 11C is equal to a thickness of the first dielectric material 11D. The plurality of first metal vias 12V is embedded in a second dielectric material 12D; the plurality of first metal vias 12V is configured on a bottom side of the first circuit 11C.

The first redistribution layer RDL1 further comprises a second circuit 13C embedded in a second dielectric material 13D. A plurality of metal vias 14V electrically couples neighboring circuit layers. A thickness of the second circuit 13C is equal to a thickness of the dielectric material 13D. The plurality of metal vias 14V is embedded in a dielectric material 14D; the plurality of metal vias 14V is configured on a bottom side of the second circuit 13C.

The first circuit 11C has a top surface and a bottom surface; the top surface is coplanar with a top surface of the first dielectric material 11D, and the bottom surface is coplanar with a bottom surface of the first dielectric material 11D.

A second redistribution layer RDL2 is configured on a bottom side of the first redistribution layer RDL1; the second redistribution layer RDL2 comprises at least one layer of second circuit 21C embedded in a dielectric material 21D. A plurality of metal vias 21V electrically couples neighboring circuit layers; the second circuit 21C of the second redistribution layer RDL2 is electrically coupled to the first circuit 11C of the first redistribution layer RDL1; and the second circuit 21C fans out downwards from a bottom side of the first circuit 11C so that a density of the second metal vias 21V is smaller than a density of the first metal vias 12V. A line width of each circuit 21C is greater than a line width of each circuit 11C.

At least one chip 111 is configured on a top side of the first circuit 11C. The chip 111 includes a plurality of conductive bumps disposed on the top side of the first circuit 11C, and the conductive bumps are electrically connected to the chip 111 and the first metal vias 12V. A plurality of solder balls 26 is configured on a bottom side of the second circuit 21C.

FIG. 2B shows a 3D view for the circuit embedded status. FIG. 2B shows that a plurality of circuit 11C, each circuit 11C runs with a top surface coplanar with a top surface of the dielectric layer 11D and co-elevational with the dielectric layer 11D. A plurality of metal vias 12V passes through the dielectric layer 12D.

FIGS. 3A~6B Show a Fabrication Process for Fabricating the First Embodiment According to the Present Invention.

Figure 3A:
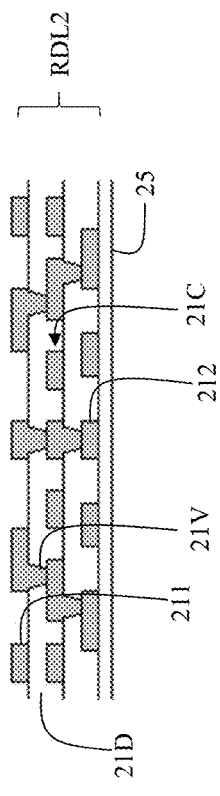
FIGS. 3A~6B show a fabrication process for fabricating the first embodiment according to the present invention.

FIG. 3A shows: preparing a redistribution layer RDL2; the redistribution layer RDL2 has at least a circuit 21C embedded in a dielectric material 21D. The circuit 21C has a plurality of top metal pads 211 and a plurality of bottom metal pads 212. A plurality of metal vias 21V electrically couples neighboring circuit layers. A dielectric material 25 is configured on a bottom side of the second redistribution layer RDL2.

Figure 3B:
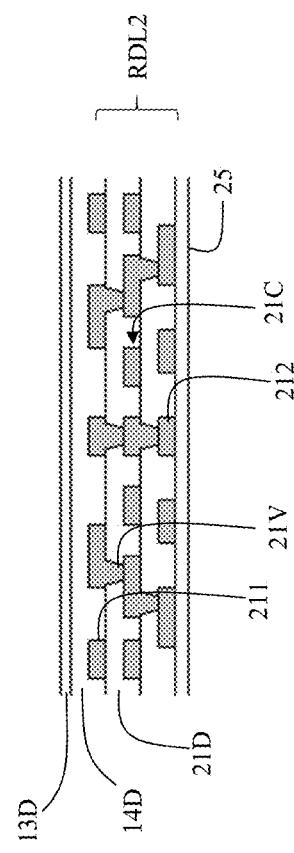

FIG. 3B shows: applying a non-photosensitive dielectric material 14D on a top side of the RDL2; and applying a photosensitive dielectric material 13D on a top side of the dielectric material 14D.

Figure 3C:
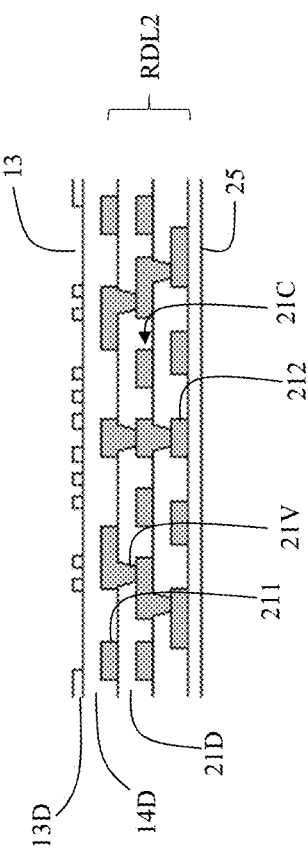

FIG. 3C shows: patterning the photosensitive dielectric material 13D to form a plurality of openings 13; the non-photosensitive dielectric material 14D on bottom functions as an etching stop layer.

Figure 4A:
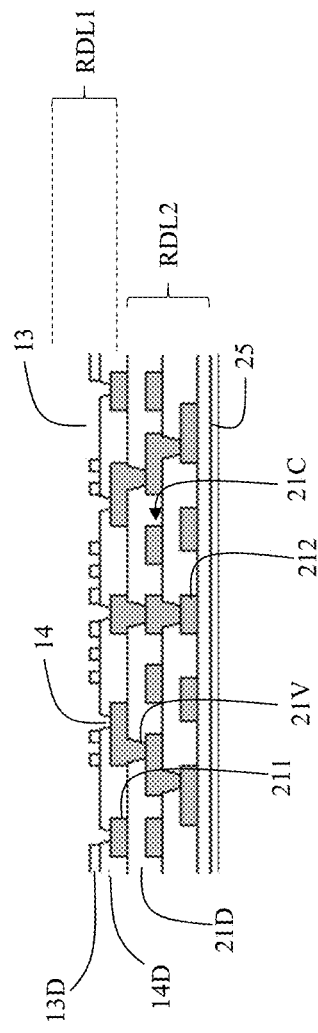

FIG. 4A shows: forming a plurality of second openings by laser drilling against the dielectric material 14D.

Figure 4B:
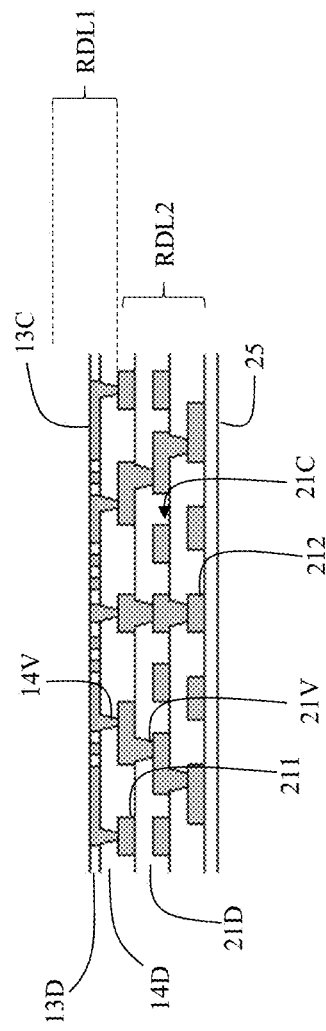

FIG. 4B shows: forming circuit 13C and a plurality of metal vias 14V.

Figure 5A:
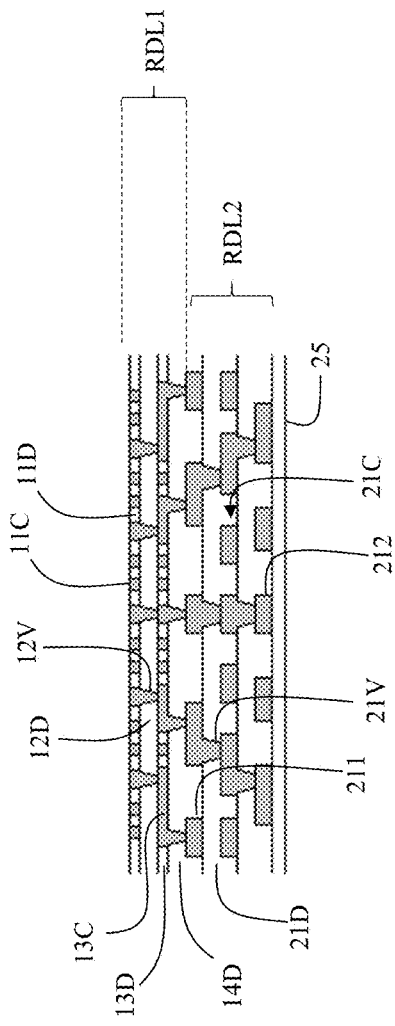

FIG. 5A shows: forming additional circuit 11C and a plurality of metal vias 12V on a top side of the circuit 13C following similar process if necessary.

Figure 5B:
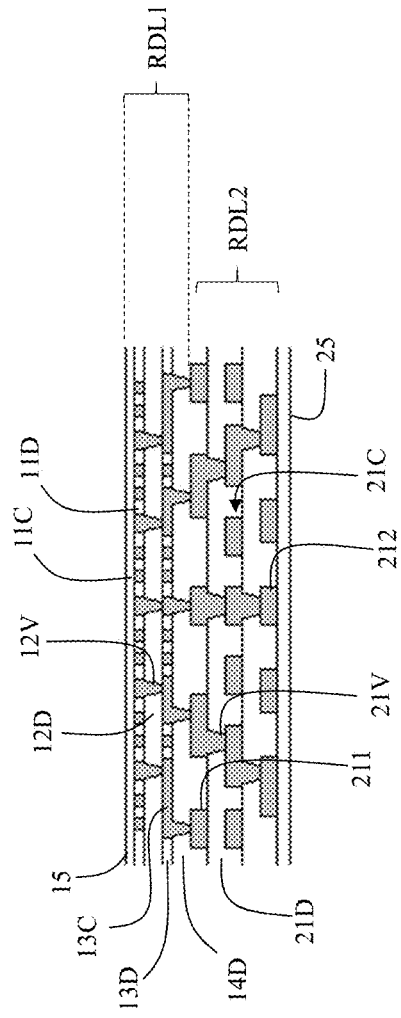

FIG. 5B shows: applying a top dielectric material 15 on a top side of circuit 11C.

Figure 6A:
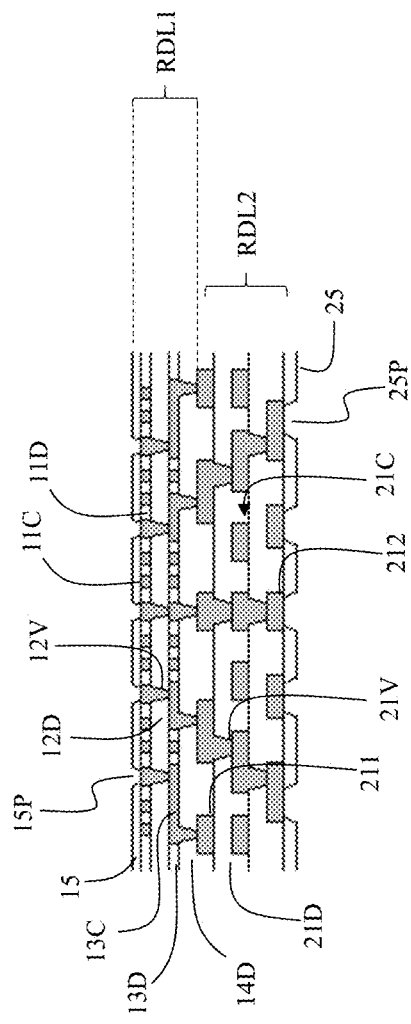

FIG. 6A shows: forming a plurality of top openings 15P on top side of the top dielectric material 15; and forming a plurality of bottom openings 25P on a bottom side of the bottom dielectric material 25.

Figure 6B:
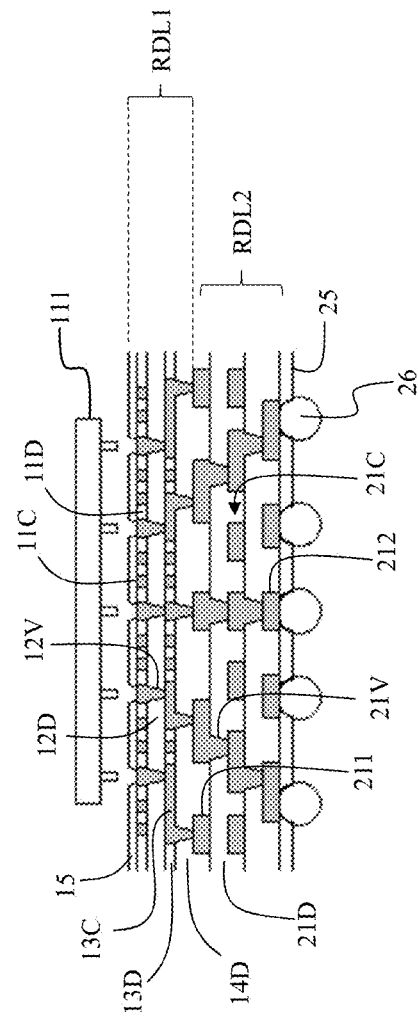

FIG. 6B shows: mounting at least one chip on a top side of the circuit 11C, and planting a plurality of solder balls 26 on a bottom side of the bottom metal pads 212.

Figure 7:
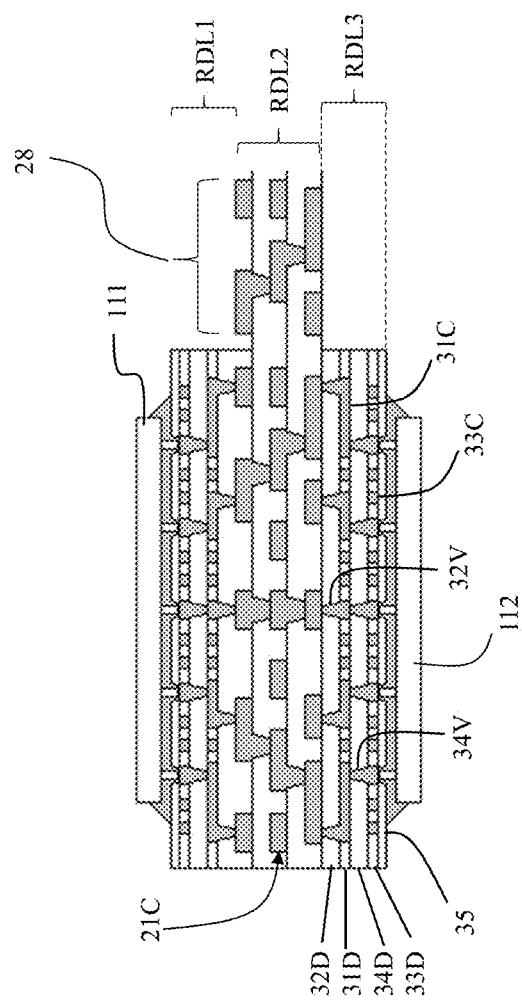
FIG. 7 shows a second embodiment according to the present invention.

FIG. 7 Shows a Second Embodiment According to the Present Invention.

FIG. 7 shows a third redistribution layer RDL3 is added to the bottom side of the second redistribution layer RDL2. The third redistribution layer RDL3 has at least a circuit 31C embedded in a dielectric material 31D. A plurality of metal vias 32V electrically couples neighboring circuit layers. A thickness of the circuit 31C is equal to a thickness of the third dielectric layer 31D. The circuit 31C of the third redistribution layer RDL3 is electrically coupled to the circuit 21C of the second redistribution layer RDL2; and the circuit 31C fans out upwards from a top side of the circuit 31C so that a density of the metal vias 21V is smaller than a density of the metal vias 32V.

The circuit 31C of the third redistribution layer RDL3 has a top surface and a bottom surface; the top surface is coplanar with a top surface of the dielectric material 31D; and the bottom surface is coplanar with a bottom surface of the third dielectric material 31D. At least one chip is configured on a bottom side of the circuit 31C of the third redistribution layer RDL3. The dielectric material 31D is a photosensitive dielectric material. A line width of each circuit 31C is smaller than a line width of each circuit 21C.

FIG. 7 shows that the second redistribution layer RDL2 has an extension portion 28 extending beyond a lateral side of one of the first redistribution layer RDL1 and the third redistribution layer RDL3; and a plurality of metal pads 282 are exposed on one of a top side and a bottom side of the extension portion 28.

Figure 8A:
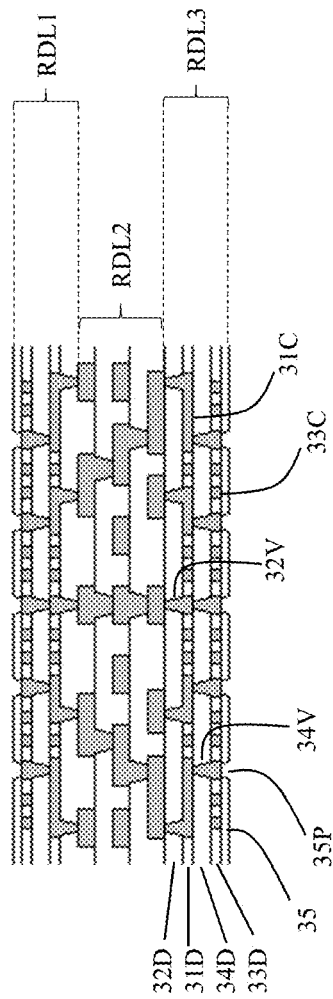
FIGS. 8A~8B show a fabrication process for fabricating the second embodiment according to the present invention.
Figure 8B:
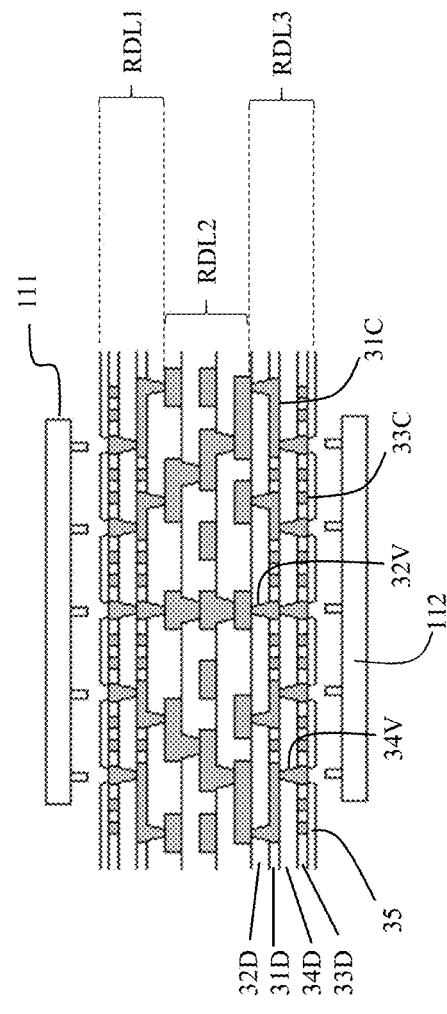

FIGS. 8A~8B Show a Fabrication Process for Fabricating the Second Embodiment According to the Present Invention.

FIG. 8A shows: a first redistribution layer RDL1 is configured on a top side of a redistribution layer RDL2, which can be prepared according to the fabrication process described for the first embodiment. Further, a third redistribution layer RDL3 is added on a bottom side of the second redistribution layer RDL2 following the process similar to the process for fabrication of the first redistribution layer RDL1.

The third redistribution layer RDL3 has at least one circuit 31C embedded in a dielectric material 31D. A plurality of metal vias 32V electrically couples neighboring circuit layers. A further circuit 33C embedded in a dielectric material 33D can be built on a bottom side of the circuit 31C if necessary.

FIG. 8B shows: at least one chip 111 can be mounted on a top side of circuit 11C of the first redistribution layer RDL1, and at least one chip 112 can be mounted on a bottom side of circuit 31C of the third redistribution layer RDL3.

Figure 9:
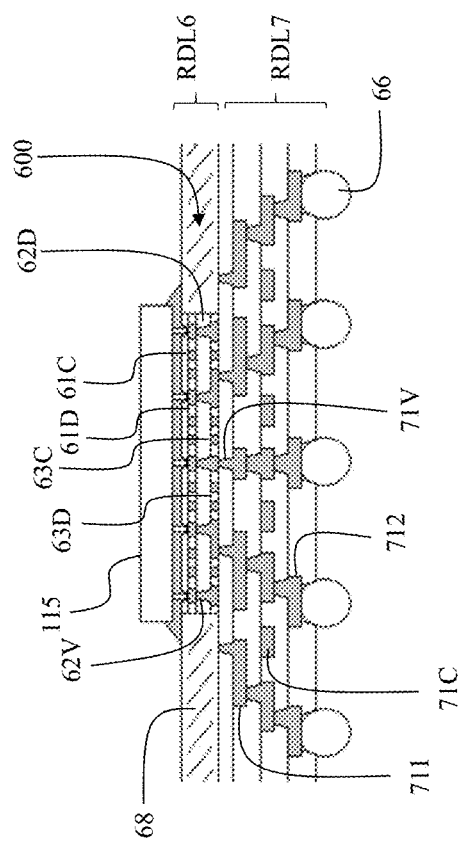
FIG. 9 shows a third embodiment according to the present invention.

FIG. 9 Shows a Third Embodiment According to the Present Invention.

Figure 12A:
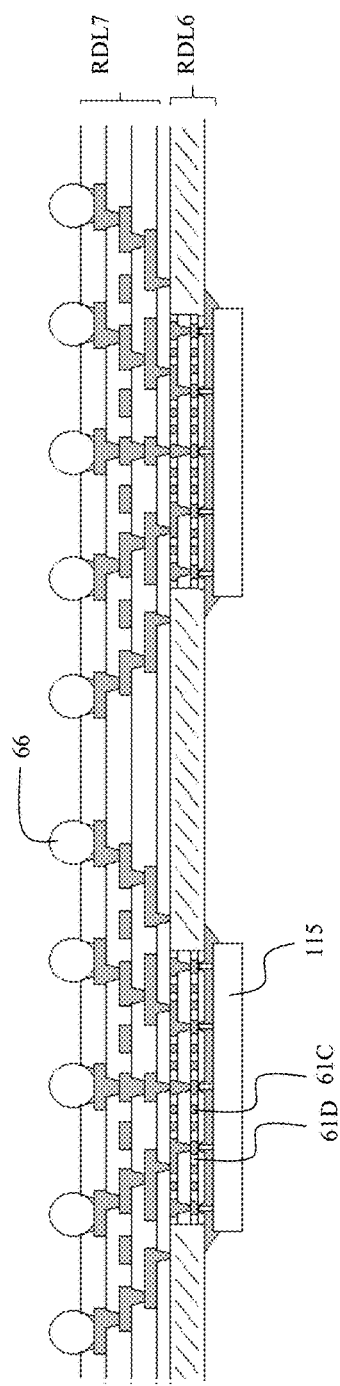
Figure 12B:
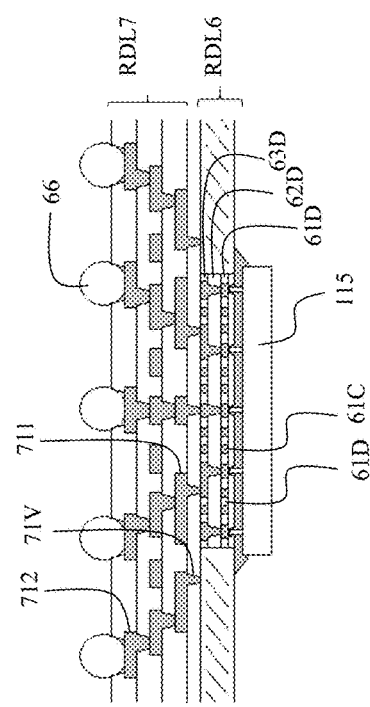

FIG. 9 shows a product the same as a product of FIG. 12B but configured in reverse for easier comparison as compared to the prior embodiments.

FIG. 9 shows a package substrate with embedded circuit which comprises a molding compound 68 encapsulating at least lateral sides of the top redistribution layer RDL6. The top redistribution layer RDL6 has at least a circuit 61C embedded in a dielectric material 61D. A thickness of circuit 61C is equal to a thickness of dielectric material 61D. A further circuit 63C embedded in a dielectric material 63D can be added. A thickness of circuit 63C is equal to a thickness of dielectric material 63D. The dielectric materials 61D, 63D are photosensitive dielectric material.

A bottom redistribution layer RDL7 is configured on a bottom side of the top redistribution layer RDL6. The bottom redistribution layer RDL7 has at least a circuit 71C embedded in a dielectric material 71D. A plurality of top metal pads 711 are configured on a top side of the redistribution layer RDL7. A plurality of bottom metal pads 712 are configured on a bottom side of the redistribution layer RDL7. A plurality of metal vias 71V electrically coupling neighboring circuit layers. The circuit 71C of the bottom redistribution RDL7 is electrically coupled to the circuit 61C of the top redistribution layer RDL6. A density of the metal vias 71V of the bottom redistribution layer RDL7 is smaller than a density of the metal vias 61V of the top redistribution layer RDL6. A plurality of solder balls 68 are configured on a bottom of the circuit 71C, each solder ball 68 is configured on a bottom side of a corresponding bottom metal pad 712. At least one chip 115 is configured on a top side of the top redistribution layer RDL6.

FIGS. 10A~12B Show a Fabrication Process for Fabricating the Third Embodiment According to the Present Invention.

Figure 10A:
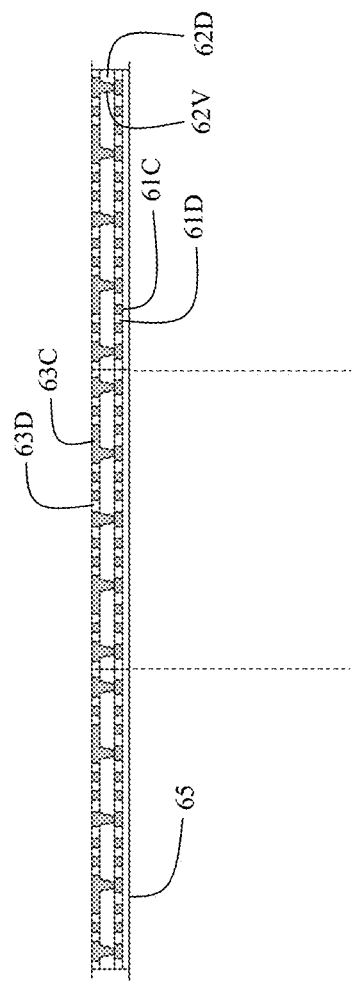
FIGS. 10A~12B show a fabrication process for fabricating the third embodiment according to the present invention.

FIG. 10A shows: fabricating a package substrate with embedded circuit. The package substrate comprises a plurality of package substrate units 600, the package substrate 600 has at least a first circuit 61C embedded in a first dielectric material 61D. A plurality of metal vias 62V electrically couples neighboring circuit layers. A second circuit 63C embedded in a third dielectric material 63D can be added. A thickness of the first circuit 61C is equal to a thickness of the first dielectric material 61D. A thickness of the third circuit 63C is equal to a thickness of the third dielectric material 63D. The dielectric 61D, 63D is a photosensitive dielectric, and the dielectric 62D is a non-photosensitive dielectric. A bottom dielectric material 65 is configured on a bottom side of the first circuit 61C.

Figure 10B:
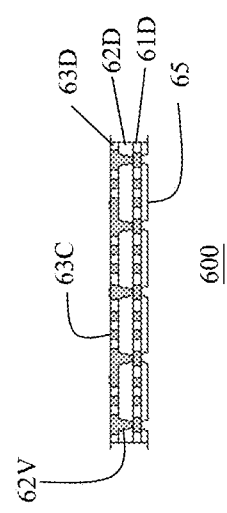

FIG. 10B shows: obtaining a plurality of package substrate units 600.

Figure 11A:
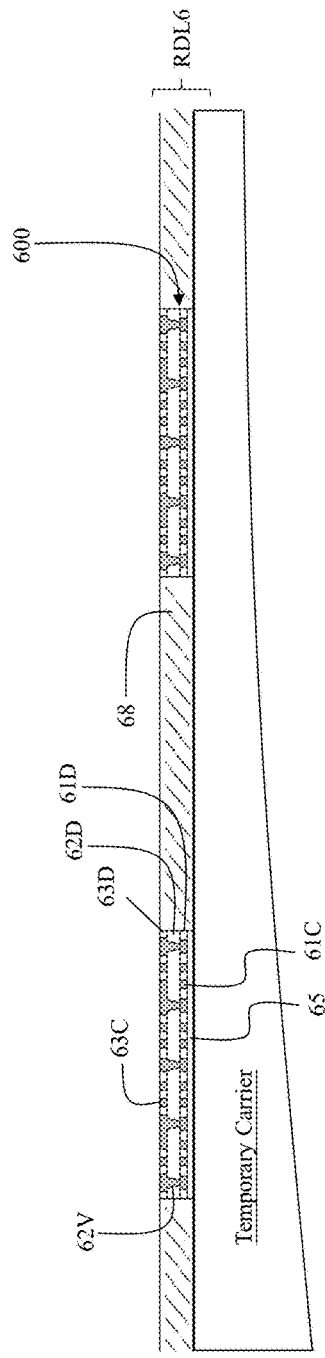

FIG. 11A shows: re-arranging the package substrate unit 600 on a temporary carrier; and molding lateral sides of the package substrate unit 600.

Figure 11B:
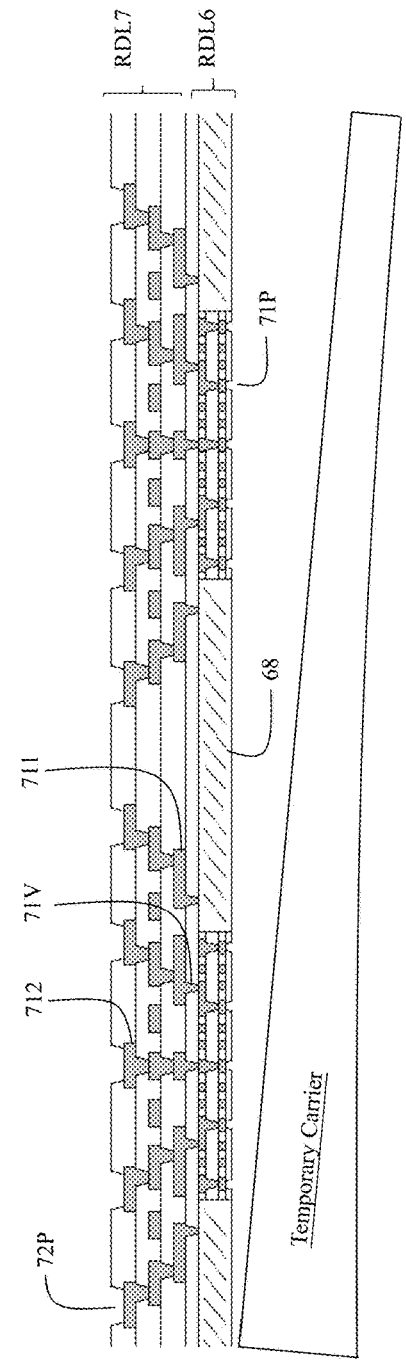

FIG. 11B shows: fabricating a second redistribution layer RDL7 on a top side of the bottom redistribution layer RDL6. A line width of each circuit of the circuitry 71C of the second redistribution layer RDL7 is greater than a line width of each circuit of the circuit 61C of the bottom redistribution layer RDL6. Each unit of the second redistribution layer RDL7 has a width greater than a width of the first redistribution layer RDL6. The second redistribution layer RDL7 extends to cover a top side of the molding compound 68. Detaching the temporary carrier, and forming a plurality first openings 71P on top of the redistribution layer RDL7, and forming a plurality of second opening 72P on bottom of the redistribution layer RDL6.

FIG. 12A shows: planting a plurality of solder balls 68 on top side of circuit 71C of the redistribution layer RDL7, and mounting at least one chip 115 on a bottom side of the circuit 61C of the redistribution layer RDL6.

FIG. 12B shows: singulating to obtain a plurality of package unit.

While several embodiments have been described by way of example, it will be apparent to those skilled in the art that various modifications may be configured without departs from the spirit of the present invention. Such modifications are all within the scope of the present invention, as defined by the appended claims.

| Numerical system |
| --- |
| circuit 11C, 13C, 21C, 31C, 61C, 63C, 71C |
| chip 111, 112, 115 |
| non-photosensitive dielectric material 12D, 14D, 62D |
| metal vias 12V, 14V, 21V, 32V, 61V, 62V, 71V |
| photosensitive dielectric material 11D, 13D, 31D, 33D, 61D, 63D, 71D |
| openings 13, 15P, 25P, 71P, 72P |
| metal vias 14V |
| dielectric layer 15, 25 |
| metal pads 211, 212 |
| solder balls 26 |
| extension portion 28 |
| metal pads 282 |
| package substrate units 600 |
| molding compound 68 |

What is claimed is:

1. A package substrate having circuit embedded therein, a chip comprising a plurality of conductive bumps and being mounted on the package substrate, the package substrate comprising:

a redistribution layer comprising a plurality of first circuits, a first dielectric material, and a plurality of metal vias extending from a top surface of the first dielectric material to a bottom surface of the first dielectric material and extending out of the first dielectric material, wherein each first circuit of the plurality of first circuits is embedded in the first dielectric material, and has a thickness equal to a thickness of the first dielectric material, a thickness of each of the metal vias is greater than the thickness of each first circuit of the plurality of first circuits, one of a top surface and a bottom surface of the first circuit completely overlaps the other in the thickness direction, and a sidewall of the first circuit extends straight from the bottom surface of the first circuit to the top surface of the first circuit.

2. A package substrate having circuit embedded therein, a chip comprising a plurality of conductive bumps and being mounted on the package substrate, the package substrate comprising:

a first redistribution layer comprising a plurality of first circuits, a first dielectric material, and a plurality of metal vias extending from a top surface of the first dielectric material to a bottom surface of the first dielectric material and extending out of the first dielectric material, wherein each first circuit among the plurality of first circuits is embedded in the first dielectric material and has a topmost surface coplanar with a topmost surface of the first dielectric material, a bottommost surface coplanar with a bottommost surface of the first dielectric material, and a thickness of each of the metal vias is greater than the thickness of each first circuit among the plurality of first circuits, wherein one of the topmost surface and the bottommost surface of the each first circuit completely overlaps the other in the thickness direction, and a sidewall of the each first circuit extends straight from the bottom surface of the each first circuit to the top surface of the each first circuit.

3. The package substrate having circuit embedded therein as claimed in claim 2, further comprising:

a second redistribution layer, on a bottom side of the first redistribution layer, wherein the second redistribution layer comprises a plurality of second circuits and a second dielectric material, and the plurality of second circuits is embedded in the second dielectric material and is electrically coupled to the plurality of first circuits.

4. The package substrate having circuit embedded therein as claimed in claim 3, wherein the chip is on a top side of the first redistribution layer.

5. The package substrate having circuit embedded therein as claimed in claim 4, further comprising:

a plurality of solder balls on a bottom side of the second redistribution layer.

6. The package substrate having circuit embedded therein as claimed in claim 3, further comprising:

a third redistribution layer on a bottom side of the second redistribution layer, wherein the third redistribution layer comprises a plurality of third circuits and a third dielectric material, each third circuit of the plurality of third circuits is embedded in the third dielectric material, and the plurality of third circuits is electrically coupled to the plurality of second circuits.

7. The package substrate having circuit embedded therein as claimed in claim 6, wherein each third circuit of the plurality of third circuits has a topmost surface coplanar with a topmost surface of the third dielectric material; and a bottommost surface coplanar with a bottommost surface of the third dielectric material.

8. The package substrate having circuit embedded therein as claimed in claim 7, wherein the chip is on a bottom side of the third redistribution layer.

9. The package substrate having circuit embedded therein as claimed in claim 7, wherein the second redistribution layer has an extension portion extending beyond a lateral side of one of the first redistribution layer and the third redistribution layer; and a plurality of metal pads exposed on one of a top side and a bottom side of the extension portion.

10. The package substrate having circuit embedded therein as claimed in claim 3, further comprising:

a molding compound encapsulating lateral sides of the first redistribution layer, wherein the second redistribution layer extends beyond a bottom surface of the first redistribution layer.

11. The package substrate having circuit embedded therein as claimed in claim 2, wherein each first circuit among the plurality of first circuits extends continuously from the topmost surface of said each first circuit to the bottommost surface of said each first circuit, and the first dielectric material extends continuously from the topmost surface of the first dielectric material to the bottommost surface of the first dielectric material.

12. The package substrate having circuit embedded therein as claimed in claim 11, wherein the first dielectric material is a photosensitive dielectric material,
the first redistribution layer further comprises
a non-photosensitive dielectric material having a topmost surface in direct contact with the bottommost surface of the photosensitive dielectric material, and
a plurality of metal vias continuous to the plurality of first circuits and embedded in the non-photosensitive dielectric material.

13. The package substrate having circuit embedded therein as claimed in claim 11, further comprising:
a second redistribution layer on a bottom side of the first redistribution layer, wherein
the second redistribution layer comprises a plurality of second circuits and a second dielectric material, and
the plurality of second circuits is embedded in the second dielectric material and is electrically coupled to the plurality of first circuits; and
a third redistribution layer on a bottom side of the second redistribution layer, wherein
the third redistribution layer comprises a plurality of third circuits and a third dielectric material,
each third circuit of the plurality of third circuits is embedded in the third dielectric material, and
the plurality of third circuits is electrically coupled to the plurality of second circuits.

14. The package substrate having circuit embedded therein as claimed in claim 13, wherein each third circuit of the plurality of third circuits has
a topmost surface coplanar with a topmost surface of the third dielectric material; and
a bottommost surface coplanar with a bottommost surface of the third dielectric material,
each third circuit among the plurality of third circuits extends continuously from the topmost surface of said each third circuit to the bottommost surface of said each third circuit, and
the third dielectric material extends continuously from the topmost surface of the third dielectric material to the bottommost surface of the third dielectric material.

15. The package substrate having circuit embedded therein as claimed in claim 14, wherein each of the first and third dielectric materials is a photosensitive dielectric material,
each of the first and third redistribution layers further comprises
a non-photosensitive dielectric material having a topmost surface in direct contact with the bottommost surface of the photosensitive dielectric material, and
a plurality of metal vias continuous to the plurality of first or third circuits and embedded in the non-photosensitive dielectric material.

16. The package substrate having circuit embedded therein as claimed in claim 2, wherein
the first dielectric material is a photosensitive dielectric material,
the first redistribution layer further comprises
a non-photosensitive dielectric material having a topmost surface in direct contact with the bottommost surface of the photosensitive dielectric material, and
a plurality of metal vias continuous to the plurality of first circuits and embedded in the non-photosensitive dielectric material.

17. The package substrate having circuit embedded therein as claimed in claim 16, further comprising:
a second redistribution layer on a bottom side of the first redistribution layer, wherein
the second redistribution layer comprises a plurality of second circuits and a second dielectric material, and
the plurality of second circuits is embedded in the second dielectric material and is electrically coupled to the plurality of first circuits; and
a third redistribution layer on a bottom side of the second redistribution layer, wherein
the third redistribution layer comprises a plurality of third circuits and a third dielectric material,
each third circuit of the plurality of third circuits is embedded in the third dielectric material,
the plurality of third circuits is electrically coupled to the plurality of second circuits,
each third circuit of the plurality of third circuits has
a topmost surface coplanar with a topmost surface of the third dielectric material; and
a bottommost surface coplanar with a bottommost surface of the third dielectric material,
each third circuit among the plurality of third circuits extends continuously from the topmost surface of said each third circuit to the bottommost surface of said each third circuit, and
the third dielectric material extends continuously from the topmost surface of the third dielectric material to the bottommost surface of the third dielectric material.

18. The package substrate having circuit embedded therein as claimed in claim 17, wherein the third dielectric material is a photosensitive dielectric material,
the third redistribution layer further comprises
a non-photosensitive dielectric material having a topmost surface in direct contact with the bottommost surface of the photosensitive dielectric material of the third redistribution layer, and
a plurality of metal vias continuous to the plurality of third circuits and embedded in the non-photosensitive dielectric material of the third redistribution layer.

19. A package substrate having circuit embedded therein, a chip comprising a plurality of conductive bumps and being mounted on the package substrate, the package substrate comprising:
a redistribution layer comprising a first layer of photosensitive dielectric material;
a plurality of first circuits embedded in the first layer of photosensitive dielectric material, having a thickness equal to a thickness of the first layer of photosensitive dielectric material;
a first layer of non-photosensitive dielectric material having a topmost surface in direct contact with a bottommost surface of the first layer of photosensitive dielectric material; and
a plurality of first metal vias continuous to the plurality of first circuits and embedded in the first layer of non-photosensitive dielectric material, wherein the first metal vias extend from a top surface of the first layer of photosensitive dielectric material to a bottom surface of the first layer of non-photosensitive dielectric material, and a thickness of each of the first metal vias is greater than the thickness of each first circuit among the plurality of first circuits,
wherein one of a top surface and bottom surface of each of the plurality of first circuits completely overlaps the other in the thickness direction, and a sidewall of the each first circuit extends straight from the bottom surface of the each first circuit to the top surface of the each first circuit.

20. The package substrate having circuit embedded therein as claimed in claim 19, wherein the redistribution layer further comprises:
   a second layer of photosensitive dielectric material having a topmost surface in direct contact with a bottommost surface of the first layer of non-photosensitive dielectric material;
   a plurality of second circuits embedded in the second layer of photosensitive dielectric material and electrically coupled to bottom ends of the plurality of first metal vias;
   a second layer of non-photosensitive dielectric material having a topmost surface in direct contact with a bottommost surface of the second layer of photosensitive dielectric material; and
   a plurality of second metal vias continuous to the plurality of second circuits and embedded in the second layer of non-photosensitive dielectric material.

\* \* \* \* \*